United States Patent [19]

On

[11] Patent Number: 4,621,370
[45] Date of Patent: Nov. 4, 1986

[54] BINARY SYNCHRONOUS COUNT AND CLEAR BIT-SLICE MODULE

[75] Inventor: Kevin Q. On, San Jose, Calif.

[73] Assignee: GTE Communication Systems Corporation, Phoenix, Ariz.

[21] Appl. No.: 614,370

[22] Filed: May 29, 1984

[51] Int. Cl.[4] .............................................. H03K 23/40
[52] U.S. Cl. ..................................... 377/106; 307/440
[58] Field of Search ............... 377/106, 105, 117, 115, 377/116; 307/440

[56] References Cited

U.S. PATENT DOCUMENTS

| | | | |
|---|---|---|---|
| 3,833,822 | 9/1974 | Carbrey | 377/105 |
| 4,360,742 | 11/1982 | Freyman | 377/117 |
| 4,366,394 | 12/1982 | Clendening et al. | 377/115 |
| 4,464,774 | 8/1984 | Jennings | 377/105 |

OTHER PUBLICATIONS

Hayes, John P., "A Survey of Bit-Sliced Computer Design," *Advanced Microprocessors,* pp. 277-300.
A Survey of Bit-Sliced Computer Design by John P. Hayes, pp. 203-250, vol. 5, Journal of Digital Systems published by Computer Sciences Press, Inc. 1981.

*Primary Examiner*—John S. Heyman
*Assistant Examiner*—Karl Ohralik
*Attorney, Agent, or Firm*—Douglas M. Gilbert

[57] ABSTRACT

A binary synchronous bit-sliced counter comprising a plurality of cascaded identical stages (slices). Each stage only requires for its operation a source of potential $V_{dd}$, a carry-in signal input line, a clock signal input line, a reset signal input line and a carry-out signal output line. Cascading of the slices is implemented by connecting the carry-out signal output line of one slice to the carry-in signal input line of another slice and connecting the clock signal and reset signal input lines to all cascaded stages in parallel.

4 Claims, 3 Drawing Figures

BINARY SYNCHRONOUS COUNT AND CLEAR BIT-SLICE MODULE

BACKGROUND OF THE INVENTION

The present invention relates to binary counters in general and in particular to a binary synchronous bit-sliced counter comprising a plurality of identical cascaded stages.

Conventional binary counters comprise a plurality of stages of flip-flops, or the like. The number of stages in a given counter depends on the capacity required.

In its implementation, the conventional binary counter requires control logic which is coupled to the flip-flops in each stage. As the capacity of a counter is increased, there is a corresponding increase in the complexity of the control logic required to implement the counter. As the complexity of the control logic increases, the amount of space required therefor on a printed circuit board, silicon chip, or the like, also increases. For relatively large capacity counters, the resulting complexity of the implementing control logic can make the task of laying out the necessary circuitry within a relatively small space, as in a VLSI circuit, very difficult, if not impossible.

SUMMARY OF THE INVENTION

In view of the foregoing, a principal object of the present invention is a novel binary synchronous bit-sliced counter having a novel counter stage comprising three signal inputs and one signal output.

Another object of the present invention is a binary synchronous bit-sliced counter comprising a plurality of the above described slices which are cascaded by connecting the signal output of one stage to a predetermined one of said three signal inputs of another stage. The remaining two signal inputs comprise a clock input and a reset signal input which are coupled in parallel to corresponding signal inputs of each of said plurality of stages.

A principal feature and advantage of a counter slice made in accordance with the present invention is the lack of a need for complex control logic to implement the counter. Without complex control logic virtually no routing of circuitry is required. With virtually no routing of circuitry required, plural counter stages can be densely packed. Circuit layout can be reduced to a minimum thereby providing a counter with short transmission delays and a high speed of operation. Another obvious advantage of bit-slicing is its applicability to computer-aided design (CAD) tools since each stage is identical.

In a preferred embodiment, the invention is implemented in an integrated circuit package using CMOS technology.

BRIEF DESCRIPTION OF THE DRAWING

The above and other objects, advantages and features of the present invention will become apparent from the following detailed description of the accompanying drawings in which.

DETAILED DESCRIPTION OF THE INVENTION

Figure 1:
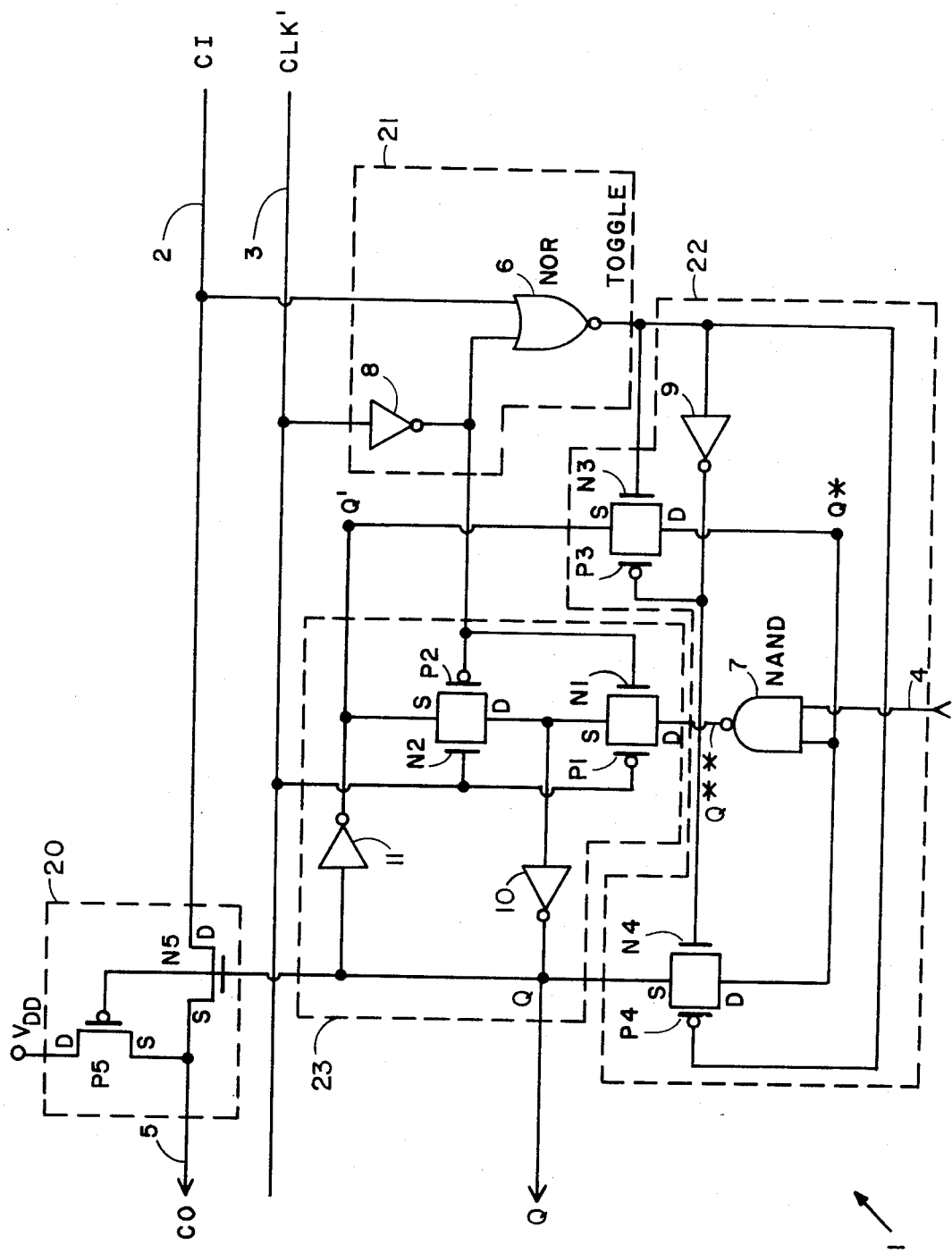
FIG. 1 is a block diagram of a bit-slice counter according to the present invention.

FIG. 1 shows, in accordance with the present invention, a binary synchronous count and clear bit-slice design designated generally as 1. In FIg. 1, there are input signal lines 2, 3, and 4, an output signal line 5, a two input NOR gate 6, a two input NAND gate 7, inverters 8, 9, 10, and 11, CMOS transmission gates P1,N1; P2,N2; P3,N3; and P4,N4, and a pair of CMOS transistors P5,N5. The designation P stands for a P-channel transistor and the designation N stands for an N-channel transistor. The lines 2, 3, 4 and 5 are also designated CI, CLK', R' and CO, respectively, for identifying the functional signals applied thereto. CI stands for Carry-in signal, CLK' stands for Clock signal, R' stands for Reset signal and CO stands for Carry-out signal.

Coupled to line 2 is one input of NOR gate 6 and the drain of the N-channel transistor N5. Coupled to line 3, is the input of inverter 8, the gate of the N-channel transistor N2 and the gate of the P-channel transistor P1. Coupled to the output of inverter 8, is the second input of NOR gate 6, the gate of the P-channel transistor P2 and the gate of the N-channel transistor N1. The output of the NOR gate 6 is coupled to the gates of the N-channel and P-channel transistors N3 and P4, respectively, and the input of the inverter 9. The output of the inverter 9 is coupled to the gates of the P-channel and N-channel transistors P3 and N4, respectively. Coupled to the line 4, is one input of the NAND gate 7. The second input of the NAND gate 7 is coupled to the drains of the transmission gates P3,N3 and P4,N4. The line coupling the NAND gate 7 and the transmission gates P3,N3 and P4,N4 is designated as node Q*.

The output of the NAND gate 7, identified for convenience as Q**, is coupled to the drain of the transmission gate P1,N1. The source of gate P1,N1 is coupled to the input of the inverter 10 and the drain of the transmission gate P2,N2. The output of the inverter 10 is coupled to the source of the transmission gate P4,N4, the input of the inverter 11, the gate of the N-channel transistor N5 and the gate of the P-channel transistor P5. The line interconnecting these components is designated as node Q.

The output of the inverter 11 is coupled to the sources of the transmission gates P2,N2 and P3,N3, respectively. The line interconnecting these components is designated as Q'. The inverters 10, 11 and the transmission gates P1,N1 and P2,N2 form a bistable circuit 23 wherein Q and Q' are used to designate the TRUE and NOT TRUE states of the circuit. A potential source $V_{dd}$ is coupled to the drain of the P-channel transistor P5. The source of P5 is coupled to the source of the N-channel transistor N5 and the carry-out signal output line 5. P5 and N5, designated as 20, perform the logical function $CO = Q' - CI$, where + is used to designate the logic OR function. A second bistable circuit, designated as 22, includes transmission gates P3,N3 and P4,N4, NAND 7 and inverter 9.

Figure 2:
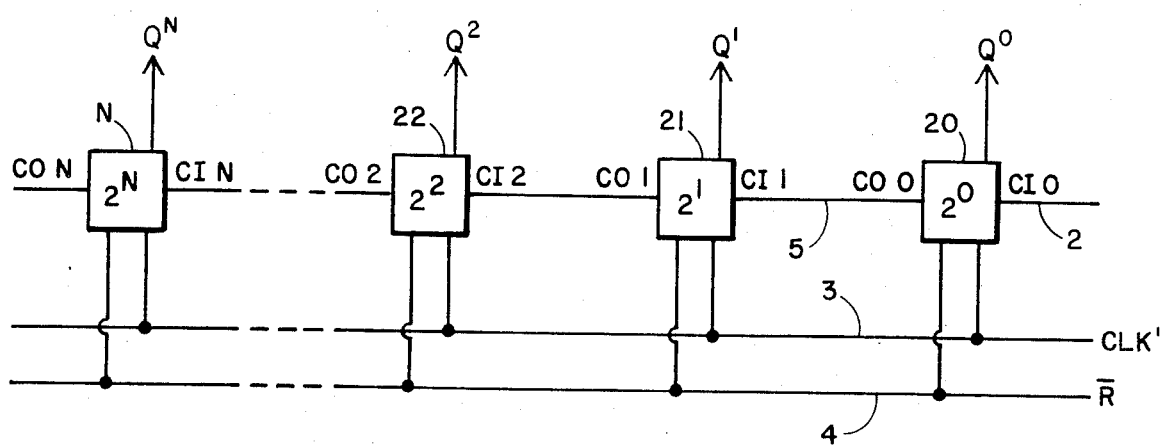
FIG. 2 is a block diagram of a plurality of cascaded slices wherein each stage is identical to the stage of FIG. 1.

Referring to FIG. 2, there is shown a plurality of cascaded bit-slice stages designated 20, 21, 22 . . . N having binary output signals $Q^1$, $Q^2$, . . . $Q^N$, respectively. Stage 20 corresponds to the least significant stage and stage N corresponds to the most significant stage. The stages are also designated by their respective binary value as $2^0$, $2^1$, $2^2$, and $2^N$.

The carry-in signal input line 2 and the carry-out signal output line 5 of the stage described above with respect to FIG. 1 are shown coupled to stage 20. In accordance with the present invention, plural stages are cascaded by coupling the carry-out signal line of one stage and the carry-in signal line of another stage. For convenience, the carry-in input lines and carry-out output lines of stages 21, 22 and N are designated CI1, CI2, and CIN and CO1, CO2 and CON, respectively. The Clock line 3 (CLK') and the Reset line 4 (R') are coupled in parallel to each of the stages.

Figure 3:
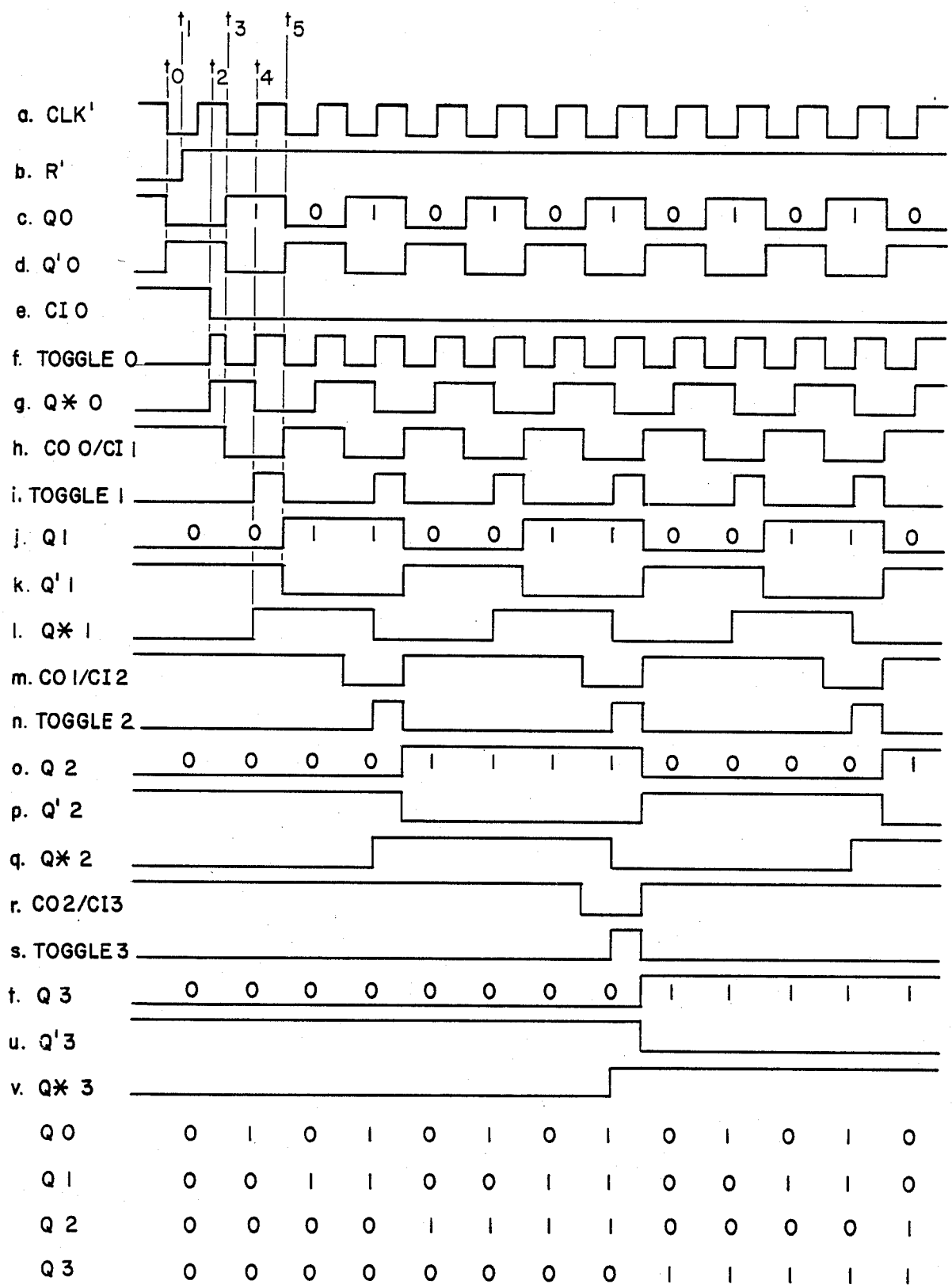
FIG. 3 is a timing diagram showing the operation of a counter comprising a plurality of counter slices according to the present invention.

Referring to FIG. 3, there is shown a series of timing diagrams a-v which represent the operation of four stages of a binary synchronous counter made in accordance with the present invention.

Referring to FIG. 1 and to two timing diagrams (a and b) of FIG. 3, in operation, all of the stages of the counter-slice, made in accordance with the present invention, are reset or cleared by the application of a low binary level ("0") on the reset input signal line 4 (R') when the CLK' signal is also low. More precisely, at time $t_0$ a low ("0") CLK' input (as shown by diagram a) is conducted to gate N2, gate P1, and the input of inverter 8. Inverter 8 places a high ("1") on the gates P2 and N1 and on one input of NOR 6. This causes P1,N1 to turn ON, N2,P2 to turn OFF, and the output of NOR gate 6 to be low.

The output of NOR gate 6 will be low independent of the second input (CI) when CLK' is low ("0"). The NOR function of NOR gate 6 means that $TOGGLE = \overline{CI \cdot CLK'}$. A low TOGGLE signal will switch P3,N3 OFF and P4,N4 ON. A low ("0") on the reset input to NAND gate 7 (as shown by diagram b) at time $t_0$ produces a high ("1") on its output which is transmitted through transmission gate P1,N1 to the input of inverter 10 and the drain of N2,P2. Inverter 10 forces node Q low (as shown by diagram c) and node Q* low (as shown by diagram g) through an ON P4,N4 switch. This latches NAND 7 output Q high independent of the state of R'. (Or in terms of the input variable to NAND 7, $Q^{} = TOGGLE \oplus Q' + \overline{R'}$ where $\oplus$ is the exclusive OR function.) A low on node Q is inverted by inverter 11 which produces a high on node Q' (as shown by diagram d). The bistable circuit 23 will stay in this state until switched or toggled. At time $t_1$, R' goes high setting up NAND gate 7 to be switched.

Switching of the bistable circuit 23 is accomplished by driving the carry-in (CI) signal input line 2 low when CLK' is also low. At time $t_2$, CI (diagram e) is driven low when CLK' is high. Both inputs to NOR gate 6 will be low and, therefore, the output of NOR gate 6 will go high generating a TOGGLE signal or pulse (as shown in diagram f). A high CLK' signal in combination with inverter 8 also turns N2,P2 ON and P1,N1 OFF. And, a high TOGGLE signal in combination with inverter 9 turns P3,N3 ON and P4,N4 OFF. When P3,N3 turns ON the Q' high forces node Q* high (as shown by diagram g).

At the trailing edge of the clock pulse CLK' going low, $t_3$ in FIG. 3, N2 and P1 go from high to low and inverter 8 and NOR gate 6 switch states (causing the TOGGLE signal to go low—diagram f). The low CLK' is conducted to gates N2 and P1. The output of inverter 8 going high places a high on the gates of P2 and N1 which switches N2,P2 OFF and P1,N1 ON. When P1,N1 turns ON, the low output of NAND gate 7 switches the input to inverter 10 low and node Q switches high. A high Q, through P4,N4, keeps Q* high, and inverter 11 switches Q' low. Thus when node Q is driven high, the bistable circuit 23 is switched or set as shown in diagram c. At the same time, the high on node Q turns ON transistor N5 and turns OFF transistor P5.

Transistor P5 removes the binary high level provided by $V_{dd}$ on the carry-out output line 5, while turning ON transistor N5 transmits the low level on the carry-in signal input line 2 to the carryy-out output signal line 5 (as shown by diagram h).

With the carry-in input signal on the line 2 (CI) maintained at a low level, another TOGGLE signal or pulse will be generated at time $t_4$ when the CLK' signal goes high (as shown in diagram f). With the CI input to NOR gate 6 low and the output of inverter 8 going low, NOR gate 6 switches to a high state. In addition N2,P2 and P3,N3 turn ON and P1,N1 turns OFF. This will cause node Q* to follow Q' and go low. When the CLK' goes low again at $t_5$, NOR gate 6 switches causing the TOGGLE to go low, node Q will be driven high by Q* through NAND gate 7, P1,N1 and inverter 10 path. Thus it can be seen that node Q will alternate between high and low binary levels in each succeeding clock period. Note that during the time that CLK' goes high transmission gate N2,P2 turns ON, therefore, latching the bistable circuit 23.

Referring to diagrams i-m, it can be seen that the operation of stage 21 of the counter of FIG. 2 is identical to the operation of the above described first stage with the exception that node Q is switched every two clock periods due to the fact that the carry-in signal applied to the carry-in signal input line of the second stage is not maintained at a low binary value, but, periodically changes between low and high binary values as shown in diagram h.

Referring to diagrams n-r and s-v, it can be seen that the operation of the third and fourth stages of the counter is identical to the operation of the first and second stages except that node Q is switched every four and eight clock periods, respectively, because of the periodic changes in the binary level of their respective carry-in signals, as discussed above with respect to the second stage.

To verify that the counter does indeed provide an increasing binary output with each succeeding clock period, it is convenient to place binary 1's and 0's on the diagrams c, j, o, and t of the node Q for each of the stages. When this is done, it can be seen clearly that binary operation is achieved by reading the vertical columns of 1's and 0' from left to right as shown in the table below the diagrams.

While a preferred embodiment of the present invention is described, it is contemplated that various modifications may be made thereto without departing from the spirit and scope of the invention. Accordingly, it is intended that the above description be considered as merely illustrative of the invention and that the scope of the invention be determined by the claims hereinafter provided.

What is claimed is:

1. A binary synchronous bit-slice counter capable of being cascaded to form a multi-stage counter, said bit-slice counter comprising:

a carry-in signal (CI) input line for receiving a binary CI signal;

a carry-out (CO) signal output line for transmitting a binary CO signal;

a clock signal (CLK') input line for receiving a binary CLK' signal alternating between first and second binary states;

a reset signal (R') input line for receiving a binary R' signal;

a first bistable circuit means having complementary output signals Q and Q', said Q and Q' signals exhibiting first and second stable states and changing from one state to the other every full clock cycle;

first logic circuit means responsive to said Q' and said CI for generating said CO, such that $$CO = Q' + CI;$$

second logic circuit means responsive to said CI and said CLK' for generating an output signal CLK' and for generating an output signal TOGGLE, such that $$TOGGLE = \overline{CI} \cdot CLK';$$

second bistable circuit means responsive to said TOGGLE, R', and Q' for generating an output signal Q, such that $$Q^{} = TOGGLE \oplus Q' + \overline{R'};$$

said first bistable circuit means being responsive to said Q and said CLK' such that $Q = \overline{Q^{}}$ when CLK' is in said first binary state.

2. A bit-slice counter as in claim 1 wherein said first bistable circuit comprises:

a first inverting amplifier having a first input terminal and a second output terminal, said amplifier providing said Q' at said second terminal;

a second inverting amplifier having a third input terminal and a fourth output terminal, said fourth output terminal being connected to said first terminal, said second amplifier providing said Q at said fourth output terminal;

a first CMOS transmission gate having a noninverting input gate constituting a fifth terminal, an inverting input gate constituting a sixth terminal, a first source and a first drain, said fifth terminal being connected to said CLK' input line, said sixth terminal receiving said CLK from said second logic circuit, said first drain being connected to said third input terminal and said first source being connected to said second terminal;

a second CMOS transmission gate having an inverting input gate constituting a seventh terminal, a noninverting input gate constituting an eighth terminal, a second source and a second drain, said seventh terminal connected to said CLK' input line, said eighth terminal being connected to said sixth terminal, said second source being connected to said third terminal and to said second drain for receiving said Q** from said second bistable circuit means.

3. A synchronous bit-slice binary counter for generating binary count output signals $Q^0, Q^1, Q^2, \ldots Q^N$, said binary counter comprising:

a plurality of like bit-slice binary counter stages disposed in a linear array, each stage comprising:

a carry-in signal (CI) input line for receiving a binary CI signal;

a carry-out signal (CO) output line for transmitting a binary CO signal;

a clock signal (CLK') input line for receiving a CLK' signal alternating between first and second binary states;

a reset signal (R') input line for receiving a binary R' signal;

first bistable circuit means having complementary output signals Q and Q', said Q and Q' exhibiting first and second stable states and changing from one state to the other every full clock cycle;

first logic circuit means responsive to said Q' and said CI for generating said CO, such that $$CO = Q' + CI;$$

second logic circuit means responsive to said CI and said CLK' for generating a CLK output signal and for generating an output signal TOGGLE, such that $$TOGGLE = \overline{CI} \cdot CLK';$$

a second bistable circuit means responsive to said TOGGLE, R', and Q' for generating an output signal $$Q^{**} = TOGGLE \oplus Q' + \overline{R'};$$

and said first bistable circuit means being responsive to said Q and said CLK' such that $Q = \overline{Q^{}}$ when CLK' is in said first binary state;

means for connecting said plurality of clock signal input lines in parallel for receiving said CLK';

means for connecting said plurality of reset signal input lines in parallel for receiving said R';

means for connecting each of said carry-in signal input lines, other than the first stage carry-in input, to said carry-out signal output lines of the preceding counter stage; and means for providing a plurality of signal output lines each for transmitting one of said binary count output signals Q, and the plurality thereby providing $Q^0, Q^1, Q^2, \ldots Q^N$.

4. A bit-slice counter as in claim 3 wherein said first bistable circuit comprises:

a first inverting amplifier having a first input terminal and a second output terminal, said amplifier providing said Q' at said second terminal;

a second inverting amplifier having a third input terminal and a fourth output terminal, said forth output terminal being connected to said first terminal, said second amplifier providing said Q at said fourth output terminal;

a first CMOS transmission gate having a noninverting input gate constituting a fifth terminal, an inverting input gate constituting a sixth terminal, a first source and a first drain, said fifth terminal connected to said CLK' signal input line, said sixth terminal receiving said CLK' from said second logic circuit, said first drain being connected to said third input terminal, and said first source connected to said second terminal;

a second CMOS transmission gate having an inverting input gate constituting a seventh terminal, a noninverting input gate constituting an eighth terminal, a second source, and a second drain, said seventh terminal connected to said CLK' signal input line, said eighth terminal connected to said sixth terminal, said second source being connected to said third terminal and to said second drain for receiving said Q** from said second bistable circuit means.

* * * * *